(12) United States Patent
West

(10) Patent No.: US 8,354,684 B2
(45) Date of Patent: Jan. 15, 2013

(54) PACKAGING PHOTON BUILDING BLOCKS HAVING ONLY TOP SIDE CONNECTIONS IN AN INTERCONNECT STRUCTURE

(75) Inventor: R. Scott West, Pleasanton, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/987,148

(22) Filed: Jan. 9, 2011

(65) Prior Publication Data

US 2012/0175643 A1  Jul. 12, 2012

(51) Int. Cl.
*F21V 5/04* (2006.01)

(52) U.S. Cl. ............................. 257/98; 257/99; 362/800

(58) Field of Classification Search ................... 257/98, 257/99; 362/800
See application file for complete search history.

(56) References Cited

U.S. PATENT DOCUMENTS

| | | | |
|---|---|---|---|
| 6,576,488 B2 | 6/2003 | Collins et al. | 438/29 |
| 7,344,296 B2 * | 3/2008 | Matsui et al. | 362/652 |
| 7,344,902 B2 | 3/2008 | Basin et al. | 438/27 |
| 7,352,011 B2 | 4/2008 | Smits et al. | 257/99 |
| 7,405,093 B2 | 7/2008 | Andrews | 438/26 |
| 7,452,737 B2 | 11/2008 | Basin et al. | 438/27 |
| 7,514,643 B1 | 4/2009 | Tittle | 200/314 |
| 7,655,957 B2 | 2/2010 | Loh et al. | 257/99 |
| 7,834,375 B2 | 11/2010 | Andrews | 257/100 |
| 7,858,408 B2 | 12/2010 | Mueller et al. | 438/27 |
| 8,109,652 B2 * | 2/2012 | Chen | 362/249.02 |
| 2005/0207165 A1 * | 9/2005 | Shimizu et al. | 362/362 |
| 2006/0091410 A1 | 5/2006 | Chen | |
| 2006/0138621 A1 | 6/2006 | Bogner et al. | |
| 2007/0057364 A1 | 3/2007 | Wang et al. | |
| 2008/0048200 A1 | 2/2008 | Mueller et al. | 257/98 |
| 2008/0157114 A1 | 7/2008 | Basin et al. | 257/98 |
| 2010/0252851 A1 | 10/2010 | Emerson et al. | 257/98 |
| 2011/0057205 A1 | 3/2011 | Mueller et al. | 257/84 |

FOREIGN PATENT DOCUMENTS

| | | |
|---|---|---|
| JP | 2009502024 | 1/2009 |
| KR | 1020110000001 | 1/2011 |

OTHER PUBLICATIONS

Screenshot and images downloaded from website: http://www.neopac-opto.com/index.php/NUP/neopac-universal-platform.html?yosc=1 on Jan. 8, 2011 disclosing a multi-chip LED module from NeoPac Optoelectronics Inc. (2 pages).

(Continued)

*Primary Examiner* — Michael Shingleton

(57) ABSTRACT

Standardized photon building blocks are used to make both discrete light emitters as well as array products. Each photon building block has one or more LED chips mounted on a substrate. No electrical conductors pass between the top and bottom surfaces of the substrate. The photon building blocks are supported by an interconnect structure that is attached to a heat sink. Landing pads on the top surface of the substrate of each photon building block are attached to contact pads disposed on the underside of a lip of the interconnect structure. In a solder reflow process, the photon building blocks self-align within the interconnect structure. Conductors on the interconnect structure are electrically coupled to the LED dice in the photon building blocks through the contact pads and landing pads. The bottom surface of the interconnect structure is coplanar with the bottom surfaces of the substrates of the photon building blocks.

40 Claims, 8 Drawing Sheets

OTHER PUBLICATIONS

Data sheet for Cree XLamp MP-L EasyWhite LEDs, data sheet CLD-DS26 Rev 3 2010 by Cree, Inc., 4600 Silicon Drive, Durham, NC 27703 (13 pages).
U.S. Appl. No. 12/941,799 entitled "LED-Based Light Source Utilizing Asymmetric Conductors" filed on Nov. 8, 2010. (27 pages).

Notification of International Search Report and Written Opinion of the International Searching Authority, or the Declaration, International Search Report and Written Opinion in International Application No. PCT/US2012/020607 mailed Jul. 11, 2012.

* cited by examiner

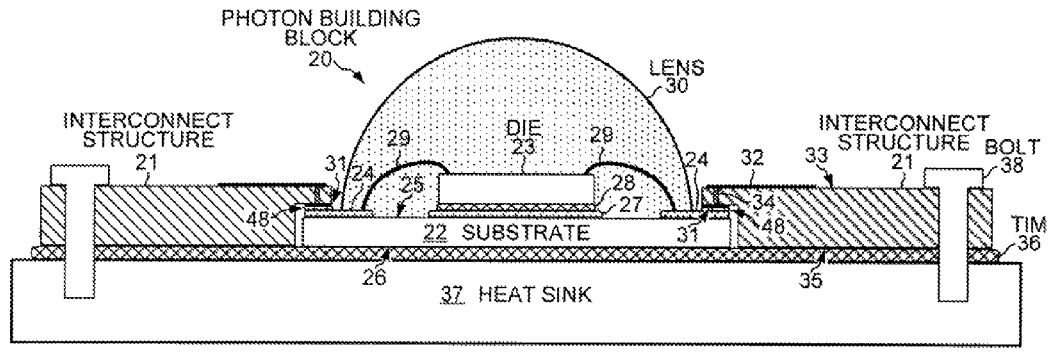
FIG. 2
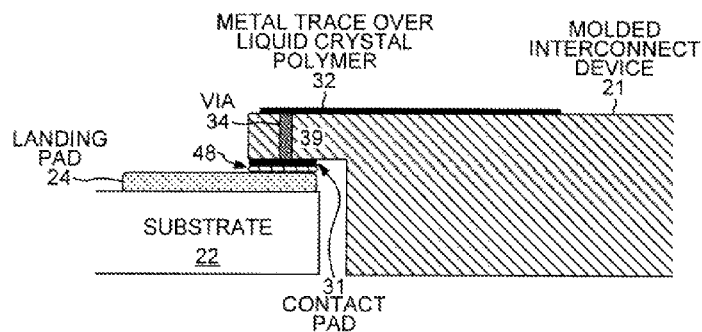
FIG. 3
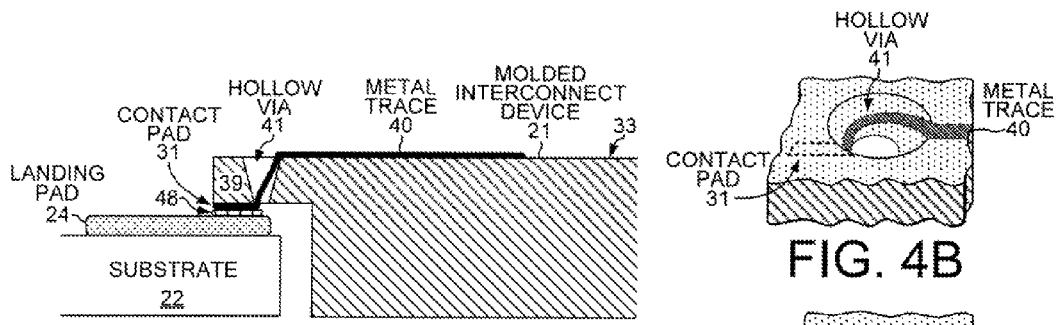
FIG. 4A
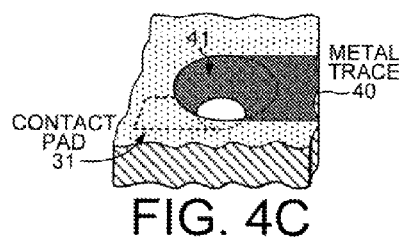
FIG. 4B
FIG. 4C

PACKAGING PHOTON BUILDING BLOCKS HAVING ONLY TOP SIDE CONNECTIONS IN AN INTERCONNECT STRUCTURE

TECHNICAL FIELD

The present invention relates generally to packaging for light-emitting diodes, and more particularly, to a photon building block that can be packaged alone as an emitter or together with other photon building blocks as an array of emitters.

BACKGROUND INFORMATION

A light emitting diode (LED) is a solid state device that converts electrical energy to light. Light is emitted from active layers of semiconductor material sandwiched between oppositely doped layers when a voltage is applied across the doped layers. In order to use an LED chip, the chip is typically enclosed in a package that focuses the light and that protects the chip from being damaged. The LED package typically includes contact pads on the bottom for electrically connecting the LED package to an external circuit. Conventionally, an LED chip is designed to be packaged either as a discrete light emitter or with a group of LED chips in an array. The LED chip of the discrete light emitter is typically mounted on a carrier substrate, which in turn is mounted on a printed circuit board. The LED chips of the array, however, are typically mounted directed on the printed circuit board without using the carrier substrate.

Array products are not conventionally made using the discrete light emitters as building blocks. The carrier substrate of the discrete light emitter is typically considered needlessly to occupy space on the printed circuit board under an array. Moreover, conducting through-hole vias through the carrier substrate of the discrete light emitter would have to be reconfigured in order to connect properly to contact pads on the printed circuit board for each new array design. Thus, no carrier with a particular set of through-holes vias could be used as a standard building block. The problem of the through-hole vias in the discrete emitters can be solved by electrically connecting the LED chips to traces and contact pads on the top side of the carrier substrate. But eliminating the through-hole vias by connecting the LED chips to pads on the top side of the carrier substrate creates the new problem of how to connect the pads to a power source because the carrier substrate is no longer electrically coupled to the printed circuit board below.

FIG. 1 (prior art) shows an existing array product 10 with an array of twenty-six LED chips electrically connected to pads 11 on the top side of a carrier substrate 12. Array product 10 is the XLamp® MP-L EasyWhite product manufactured by Cree, Inc. of Durham, N.C. In FIG. 1, carrier substrate 12 is mounted on a metal disk 13 as opposed to on a printed circuit board. Carrier substrate 12 is attached to metal disk 13 using thermal glue 14. Array product 10 is inelegantly connected to power by hand soldering individual wires of the positive 15 and negative 16 power cord leads to the pads 11. Array product 10 has no features that facilitate connecting the pads 11 on the top side of carrier substrate 12 to a power source in the board or plate below. And array product 10 is not configured to be incorporated into a group of array products.

A method is sought for using one or more LED chips mounted on a carrier substrate as a standardized building block to make both a discrete light emitter as well as an array product of multiple substrates with mounted LEDs.

SUMMARY

Standardized photon building blocks are used to make both discrete light emitters with one building block as well as array products with multiple building blocks. Each photon building block has one or more LED chips mounted on a carrier substrate. No electrical conductors pass between the top and bottom surfaces of the substrate. The photon building blocks are held in place by an interconnect structure that is attached to a heat sink. Examples of the interconnect structure include a molded interconnect device (MID), a lead frame device or a printed circuit board.

Landing pads on the top surface of the substrate of each photon building block are attached to contact pads disposed on the underside of a lip of the interconnect structure using solder or an adhesive. The lip extends over the substrate within the lateral boundary of the substrate. In a solder or SAC reflow process, the photon building blocks self-align within the interconnect structure. Molten SAC or solder alloy of the landing pads wets the metal plated contact pads, and the surface tension of the molten alloy pulls the landing pads under the contact pads. Conductors on the interconnect structure are electrically coupled to the LED dice in the photon building blocks through the contact pads and landing pads. The bottom surface of the interconnect structure is coplanar with the bottom surfaces of the substrates of the photon building blocks.

In an array product, the substrates of multiple photon building blocks are supported by the interconnect structure. The substrates of all of the photon building blocks have substantially identical dimensions. A thermal interface material is placed on the upper surface of a heat sink, and the bottom surface of the interconnect structure contacts the thermal interface material. The interconnect structure is fastened to the heat sink by bolts that pass through holes in the interconnect structure.

A method of making both a discrete light emitter and an array product using the same standardized photon building blocks supported by an interconnect structure. The method includes the step of mounting an LED die on a carrier substrate that has no electrical conductors passing from its top surface to its bottom surface. A landing pad on the top surface of the substrate is placed under and adjacent to a contact pad disposed on the underside of a lip of the interconnect structure. In order to place the landing pad under the contact pad, the lip of the interconnect structure is placed over the top surface of the substrate and within the lateral boundary of the substrate.

A conductor on or in interconnect structure is electrically connecting to an LED die on a photon building block by bonding a landing pad to a contact pad. A landing pad can be bonded to a contact pad by heating the metal alloy of the landing pad such that the landing pad aligns with the metal contact pad. Alternatively, the landing pad can be bonded to the contact pad using anisotropic conductive adhesive film (ACF) technology. For additional details on anisotropic (asymmetric) conductive adhesives, see U.S. patent application Ser. No. 12/941,799 entitled "LED-Based Light Source Utilizing Asymmetric Conductors" filed on Nov. 8, 2010, which is incorporated herein by reference. After the landing pad is aligned with and bonded to the contact pad, the bottom surface of the substrate is substantially coplanar with the bottom surface of the interconnect structure.

When the method is used to make an array product with multiple photon building blocks, a second lip of the interconnect structure is placed over the top surface of the substrate of a second photon building block, and a second landing pad on the second substrate is placed under and adjacent to a second contact pad under a lip of the interconnect structure. The second substrate of the second photon building block has dimensions that are substantially identical to those of the substrate of the first photon building block. A second conductor of the interconnect structure is electrically connected to a second LED die on the second photon building block by bonding the second landing pad to the second contact pad. After the second landing pad is bonded to the second contact pad, the bottom surface of the substrate of the second photon building block is substantially coplanar to the bottom surface of the interconnect structure.

A thermal interface material is then placed over the upper surface of a heat sink. The bottom surfaces of the interconnect structure and of the substrates of the photon building blocks are placed over the thermal interface material.

A novel light emitting device includes an LED die disposed above a substrate that includes no electrical conductors between the top and bottom surfaces of the substrate. The device also includes a means for electrically coupling the LED die to a conductor located outside the lateral boundary of the substrate. The means contacts a landing pad disposed on the top surface of the substrate. The landing pad aligns the substrate to a contact pad on the means when the landing pad is heated. The means has a bottom surface that is coplanar with the bottom surface of the substrate.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 2 is a cross-sectional view of a novel photon building block supported by an interconnect structure.

FIG. 3 is a more detailed view of a contact pad connected to a landing pad as shown in FIG. 2.

FIG. 4A is a cross-sectional view of a conductor on an interconnect structure coupled through a contact pad to a landing pad on a substrate.

FIG. 4B is a perspective view of the path of the conductor of FIG. 4A passing through a hollow via to the contact pad.

FIG. 4C is a perspective view of the conductor of FIG. 4A passing through and entirely covering the inside surface of a hollow via.

DETAILED DESCRIPTION

Figure 1:
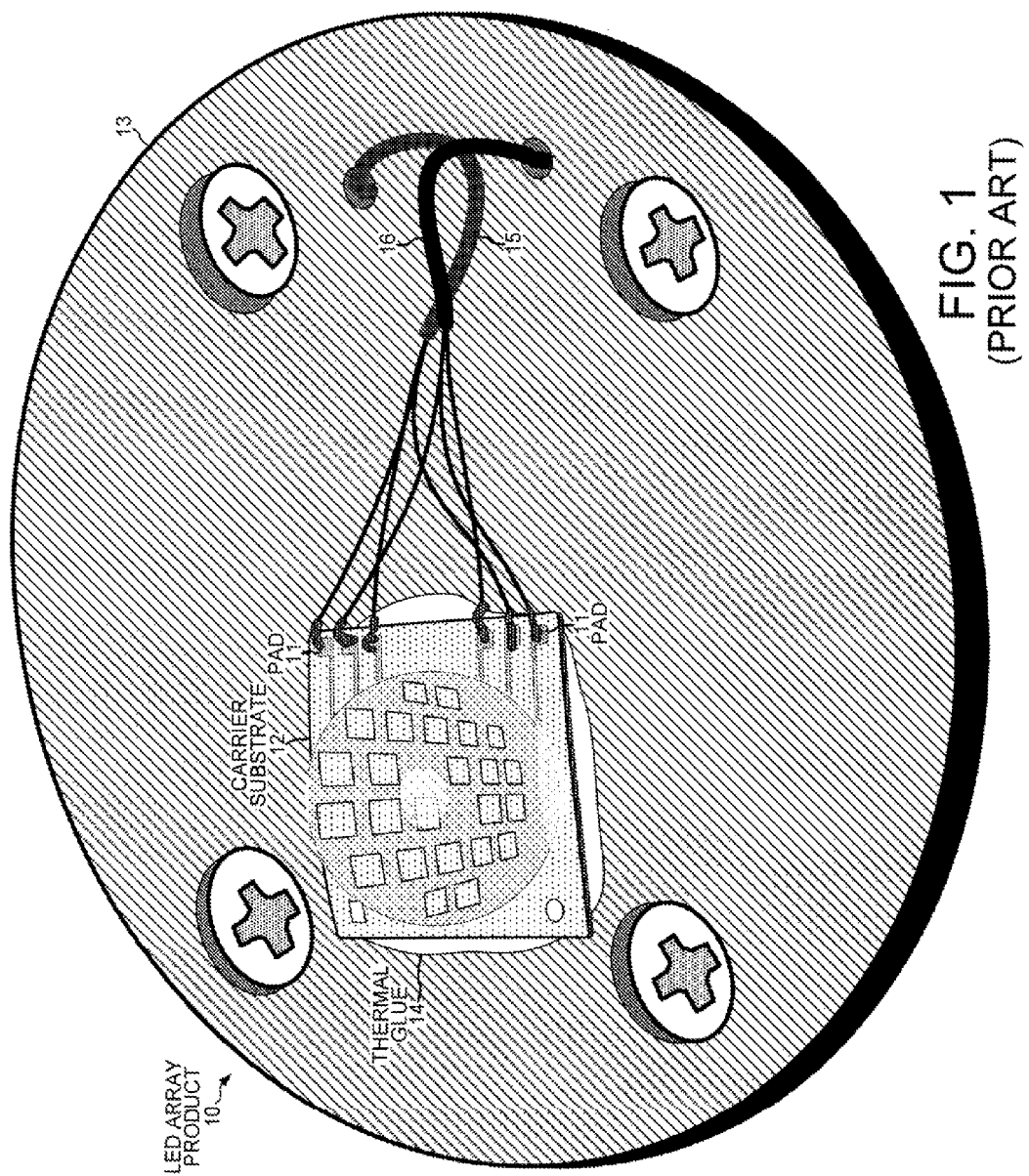
FIG. 1 (prior art) is a perspective view of an existing array product with multiple LED chips electrically connected to pads on the top side of a carrier substrate.

Reference will now be made in detail to some embodiments of the invention, examples of which are illustrated in the accompanying drawings.

FIG. 2 is a cross-sectional view of a photon building block 20 supported by an interconnect structure 21. Photon building block 20 includes a substrate 22 upon which an LED die 23 is mounted. Substrate 22 is non-conductive ceramic. In another implementation, substrate 22 is crystalline silicon. Landing pads 24 are disposed on the top surface 25 of substrate 22. No electrical conductor passes from the top surface 25 of substrate 22 to the bottom surface 26 of substrate 22. LED die 23 is electrically coupled to power solely through the landing pads 24. Thermal interface materials are disposed between LED die 23 and substrate 22. A first layer 27 of thermal interface material (TIM) is made of the same material and deposited in the same process as landing pads 24. In one implementation, pads 24 and first layer 27 are traces made of a Cu—Ni—Au alloy or a Cu—Ni—Ag alloy. A second layer 28 of thermal interface material is deposited on first layer 27. In one implementation, second layer 28 is a silver-filled epoxy. LED die 23 is bonded through second layer 28 and first layer 27 to top surface 25 of substrate 22.

LED die 23 is electrically connected through wire bonds 29 to landing pads 24. A thin conformal layer of a wavelength conversion material, such as a phosphor, is formed over LED die 23. Then a clear resin encapsulant, such as silicone, is overmolded over LED die 23 and the wire bonds 29 from about the middle of a landing pad 24 on one side of upper surface 25 of substrate 22 to about the middle of a landing pad 24 on the opposite side of upper surface 25. The silicone forms the shape of a lens 30. Photon building block 20 includes substrate 22, the landing pads 24 and everything encapsulated by lens 30.

Interconnect structure 21 supports photon building block 20 through the landing pads 24. The landing pads 24 are both electrically and mechanically connected to contact pads 31 disposed on the underside of a lip of the interconnect structure 21. In one implementation, landing pads 24 are attached to contact pads 31 by a solder paste. An example of a solder paste is a SAC alloy, such as SAC 305 (96.5% Sn, 3.0% Ag, 0.5% Cu). In another implementation, landing pads 24 are attached to contact pads 31 by an adhesive. An example of an adhesive is an anisotropic conductive adhesive associated with anisotropic conductive film (ACF) technology. In the embodiment of FIG. 2, landing pads are electrically and mechanically connected to contact pads 31 by solder 48.

In the embodiment of FIG. 2, contact pads 31 are electrically connected to conductive traces 32 on the top surface 33 of interconnect structure 21 by through-hole vias 34. Thus, each conductive trace 32 is electrically coupled to LED die 23 through via 34, contact pad 31, solder 48, landing pad 24 and wire bond 29. Interconnect structure 21 has a bottom surface 35 that is substantially coplanar with bottom surface 26 of substrate 22.

Photon building block 20 and interconnect structure 21 are attached over a third layer 36 of thermal interface material (TIM) to a heat sink 37. In one implementation, third layer 36 of thermal interface material is thermal glue. In another implementation, third layer 36 is made of thermal grease, and interconnect structure 21 is attached to heat sink 37 by bolts 38. Any small deviations of bottom surfaces 26 and 35 from being exactly coplanar are compensated by the thickness of the thermal interface material, such as the thermal grease. Bolts 38 hold interconnect structure 21 in place over heat sink 37, and photon building block 20 is held in place by the connection between landing pads 24 and contact pads 31. Thus, substrate 22 is thermally coupled through the third layer 36 of TIM to heat sink 37. In one implementation, bottom surface 26 of substrate 22 is not directly connected to heat sink 37, but is rather "floating" in the layer 36 of thermal grease. Photon building block 20 is mechanically connected to heat sink 37 only through the bonds between landing pads 24 and contact pads 31. In contrast, carrier substrate 12 of the prior art array product 10 is attached to the heat sink only by gluing or soldering the bottom surface of substrate 12 to the heat sink.

Compared to a conventional discrete light emitter, a printed circuit board (PCB) and one layer of TIM have been removed from beneath novel photon building block 20. In a conventional discrete light emitter, the carrier substrate sits on a TIM layer over a metal core PCB, which in turn sits on another TIM layer over the heat sink. Using the novel photon building blocks to make an array product is more economical than making an array product using conventional discrete light emitters because the cost of the metal core PCB and an additional TIM layer is saved. Moreover, heat generated by the LED die is more effectively transferred from the carrier substrate through one TIM layer directly to the heat sink than through an additional MCPCB and TIM layer of conventional discrete light emitters.

In another embodiment, photon building block 20 and interconnect structure 21 are not attached directly to heat sink 37 over third TIM layer 36. Instead, a thermal spreader is placed between heat sink 37 and photon building block 20. Photon building block 20 and interconnect structure 21 are then attached over third TIM layer 36 to the thermal spreader. An example of a thermal spreader is a vapor chamber.

FIG. 3 shows one of the contact pads 31 of FIG. 2 in more detail and the landing pad 24 to which the contact pad is connected. Contact pad 31 is a metal trace on interconnect structure 21. In one implementation, interconnect structure 21 is a molded interconnect device (MID). MID 21 is a three-dimensional electronic circuit carrier produced by injecting a metalized, high-temperature thermoplastic, such as liquid crystal polymer (LOP), into a mold. A laser writes the path of the trace on the surface of MID 21. Where the laser beam oblates the thermoplastic, the metal additive in the thermoplastic forms a very thin conductor path. The metal particles on the conductor path form the nuclei for subsequent metallization. Metallization baths are used to form successive layers of copper, nickel and/or gold traces on the conductor path. For example, a layer of copper forms on the conductor path when the oblated thermoplastic is placed in a copper bath. Wherever the laser can oblate the surface of MID 21, three-dimensional circuit traces can quickly be formed.

Contact pad 31 is formed on the underside of a lip 39 of MID 21 after the laser oblates the shape of the pad. Metal trace 32 is also formed on the top surface 33 of interconnect structure 21 in the same manner as contact pad 31 is formed. Either the laser is articulated so that the laser beam can be directed at both top surface 33 and the underside of a lip 39, or two lasers can be used. In the implementation of FIG. 3, through-hole via 34 is filled with metal before the traces and pads are formed. The metallization baths plate the trace 32 and contact pad 31 over the ends of metal via 34.

An electrical and mechanical connection is made between contact pad 31 and landing pad 24 by reflowing a solder alloy between the pads. For example, a SAC reflow process can be performed where a Sn—Ag—Cu solder alloy is placed at the edge of landing pad 24. When the SAC solder is melted, the solder wets the metal of contact pad 31. Then the surface tension of the molten SAC alloy pulls landing pad 24 under contact pad 31. A bond is then formed between landing pad 24 and contact pad 31 when the SAC alloy cools and solidifies.

FIG. 4A shows another implementation of how a metal trace 40 on MID 21 is electrically coupled to landing pad 24 on substrate 22. Instead of via 34 filled with metal, as in FIG. 3, MID 21 of FIG. 4A includes a hollow tapered via 41. Hollow via 41 is formed using a conical plug in the molding process that forms the molded interconnect device 21. The laser oblates a conductor path across top surface 33, around the inside surface of via 40, and then on the underside of a lip 39 to form the shape of contact pad 31. The conductor path and pad shape are then plated in a metallization bath. FIG. 4B shows the conductor path of the laser in more detail. The conductor path can be much wider than the width of the laser. The laser can make many passes to create a wide conductor path, such as the one shown in FIG. 4C. In FIG. 4C, the entire partially conical-shaped inside surface of hollow via 41 is oblated and will be plated in a metallization step.

Figure 5:
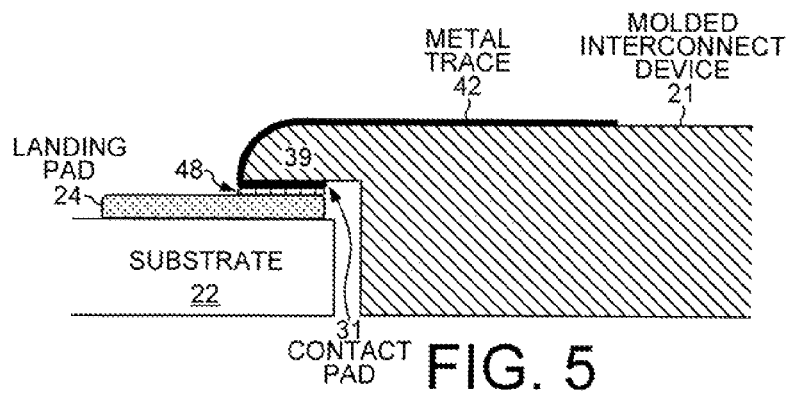
FIG. 5 is a cross-sectional view of the conductor of FIG. 4A passing around the rounded edge of a lip of the interconnect structure.

FIG. 5 shows another implementation of how a metal trace 42 on MID 21 is electrically coupled to landing pad 24 on substrate 22. Lip 39 of MID 21 is given a rounded edge. The laser makes a continuous conductor path across top surface 33, around the rounded edge and then on the underside of a lip 39.

Figure 6:
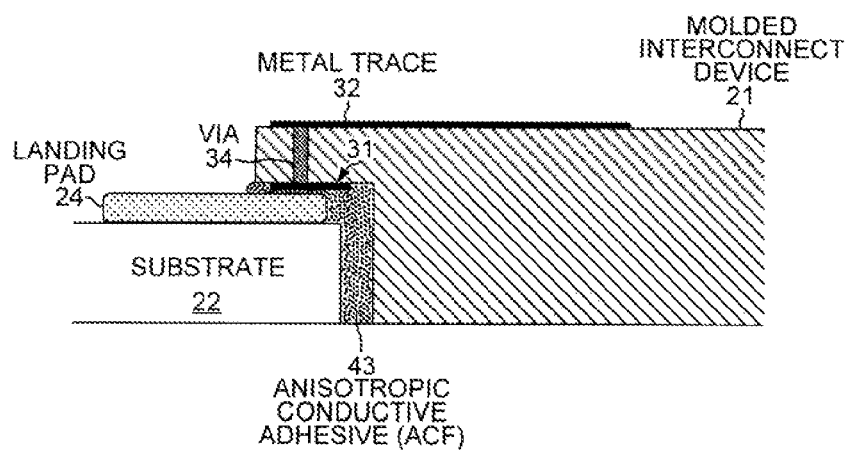
FIG. 6 shows a landing pad on the substrate bonded to a contact pad on the underside of a lip of the interconnect structure by an anisotropic conductive adhesive (ACF).

FIG. 6 shows an alternative way of electrically and mechanically coupling contact pad 31 to landing pad 24 that does not involve solder. An anisotropic conductive adhesive is used to connect contact pad 31 to landing pad 24 in FIG. 6 instead of the bond formed using solder reflow as shown in FIG. 3. Because solder is not used, photon building block 20 does not self-align within interconnect structure 21, but must be accurately positioned before the adhesive cured. Anisotropic conductive adhesive film (ACF) technology involves conductive balls dispersed in an adhesive. For example, Au-coated polymer balls or Ni-filled balls are dispersed in an epoxy adhesive. The surfaces being electrically coupled are then pressed together to the diameter of the balls. The adhesive is then cured, for example by heating. An electrical contact is made in those areas where the balls touch both surfaces. The anisotropic conductive adhesive is not conductive in those areas where the balls are still dispersed in the cured adhesive. In FIG. 6, the anisotropic conductive adhesive mechanically connects pad 31, the underside of lip 39 and the entire side of MID 21 to landing pad 24 and the side of substrate 22. However, an electrical connection is made only between those areas of contact pad 31 and landing pad 24 that were pressed together to within the diameter of the conductive balls.

Figure 7:
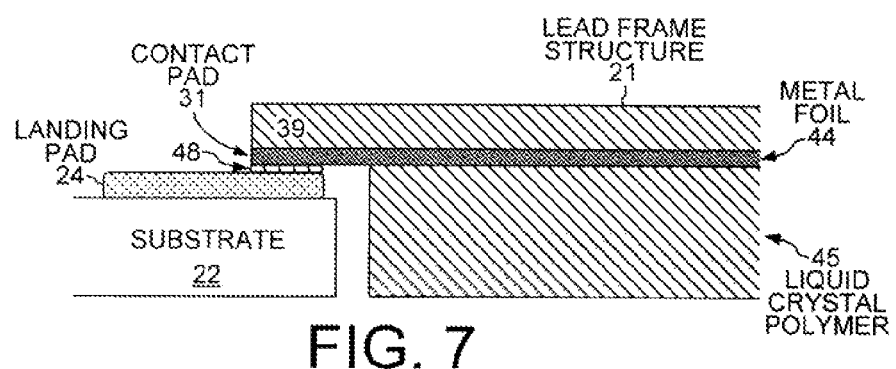
FIG. 7 shows a lead frame interconnect structure with a metal foil layer that functions both as a conductor of the interconnect structure and as a contact pad that bonds to a landing pad on the substrate.

FIG. 7 shows another implementation of how a conductor 44 on interconnect structure 21 is electrically coupled to landing pad 24 on substrate 22 using solder. Interconnect structure 21 of FIG. 7 is a lead frame instead of a molded interconnect device. A metal foil 44 is stamped in the form of the conductors, leads and "gull wings" required for the package of the discrete light emitter or array product. Lead frame structure 21 is then made by injection molding a liquid crystal polymer (LCP) 45 around a stamped metal foil 44. The metal foil functions both as the conductor 44 as well as the contact pad 31. The end of the metal foil under lip 39 can be stamped in the shape of a contact pad with a shape corresponding to the shape of landing pad 24 in order to facilitate self-alignment during a solder reflow process.

Figure 8:
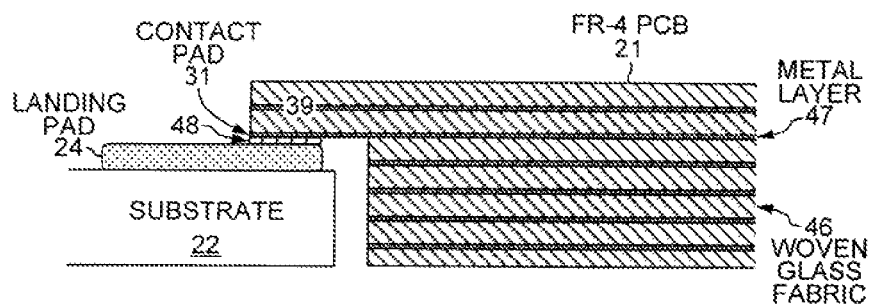
FIG. 8 shows an interconnect structure made from a printed circuit board with a metal layer that functions both as a conductor of the interconnect structure and as a contact pad that bonds to a landing pad on the substrate.

FIG. 8 shows another implementation of a conductor 46 in interconnect structure 21 that is electrically coupled to landing pad 24 on substrate 22 using solder. Interconnect structure 21 of FIG. 6 is a printed circuit board (PCB). For example, interconnect structure 21 is an FR-4 printed circuit board made of woven fiberglass fabric 46 with an epoxy resin binder. FR-4 PCB 21 has several metal layers. One of the metal layers 41 functions both as the conductor and as the contact pad 31. The end of metal layer 47 under lip 39 can be formed in a shape corresponding to the shape of landing pad 24 in order to facilitate self-alignment during a solder reflow process.

Figure 9:
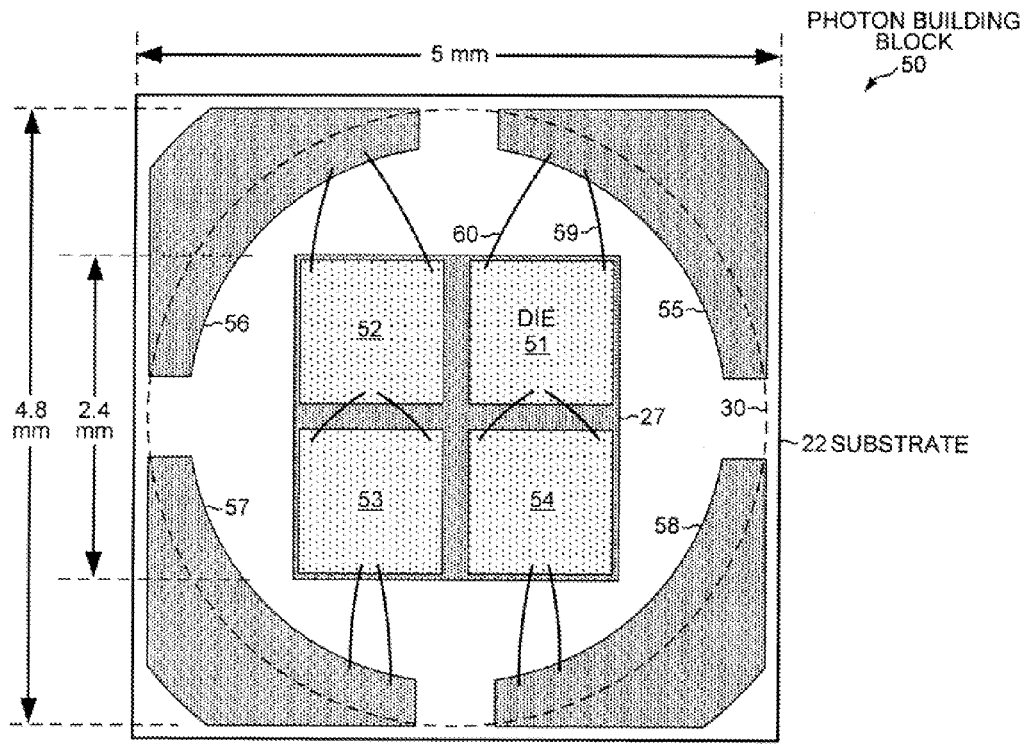
FIG. 9 is a top view of a photon building block that includes four LED dice surrounded by four landing pads.

FIG. 9 is a top view of a photon building block 50 that includes four LED dice 51-54. The same material is used to make the four landing pads 55-58 as well as the first TIM layer 27 beneath the four LEDs. Second layer 28 of thermal interface material is deposited on first layer 27 beneath each LED die and is not visible in the view of FIG. 9. LED die 51 and 54 are electrically connected in series between landing pads 55 and 58. Two wire bonds connect each LED die to a landing pad and to another LED die. For example, wire bonds 59-60 connect LED die 51 to landing pad 55. The dashed circle indicates the extent to which silicone lens 30 encapsulates the components on substrate 22. Lens 30 extends to about the middle of the landing pads 55-58. The diameter of lens 30 is about twice as long as each side of the 2×2 array of LED dice so as to allow most of the emitted light to reach the surface of lens 30 within the critical angle required for the light to escape from the lens.

Photon building block 50 can be used to make both a discrete light emitter with a single photon building block as well as an array product with multiple photon building blocks. Interconnect structure 21 can easily be molded or configured to incorporate photon building block 50 into a plurality of different discrete light emitter products. The bolt holes through which bolts 38 attach interconnect structure 21 to heat sink 37 can easily be repositioned without changing the design of photon building block 50. And the conductors that are electrically coupled to the LED dice can easily be retraced using a laser to write the conductive paths over the surface of the molded interconnect device. Thus, a new emitter need not be tested and qualified each time a new light emitter product is made using photon building block 50.

Figure 10:
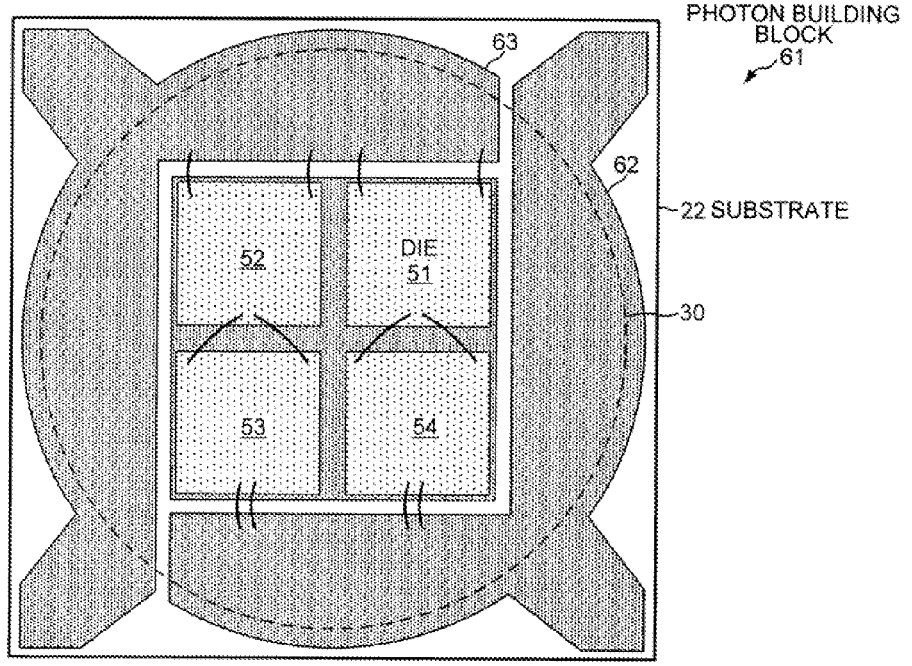
FIG. 10 is a top view of another implementation of a photon building block that includes four LED dice surrounded by two landing pads.

FIG. 10 is a top view of a photon building block 61 with only two landing pads 62-63 that surround the four LED dice 51-54. As with photon building block 50 of FIG. 9, the landing pads 62-63 and the first TIM layer 27 beneath the four LEDs are made from the same material, such as a Cu—Ni—Au alloy or a Cu—Ni—Ag alloy. The landing pads 62-63 have points that extend to the four corners of substrate 22. In a SAC reflow step, the solder alloy that extends farther toward the corners of substrate 22 than with landing pads 55-58 can more precisely align substrate 22 beneath the contact pads of the interconnect structure 21. The smaller surface area of landing pads 62-63 beneath the contact pads, however, results in a weaker mechanical connection between the landing pads and contact pads.

Figure 11A:
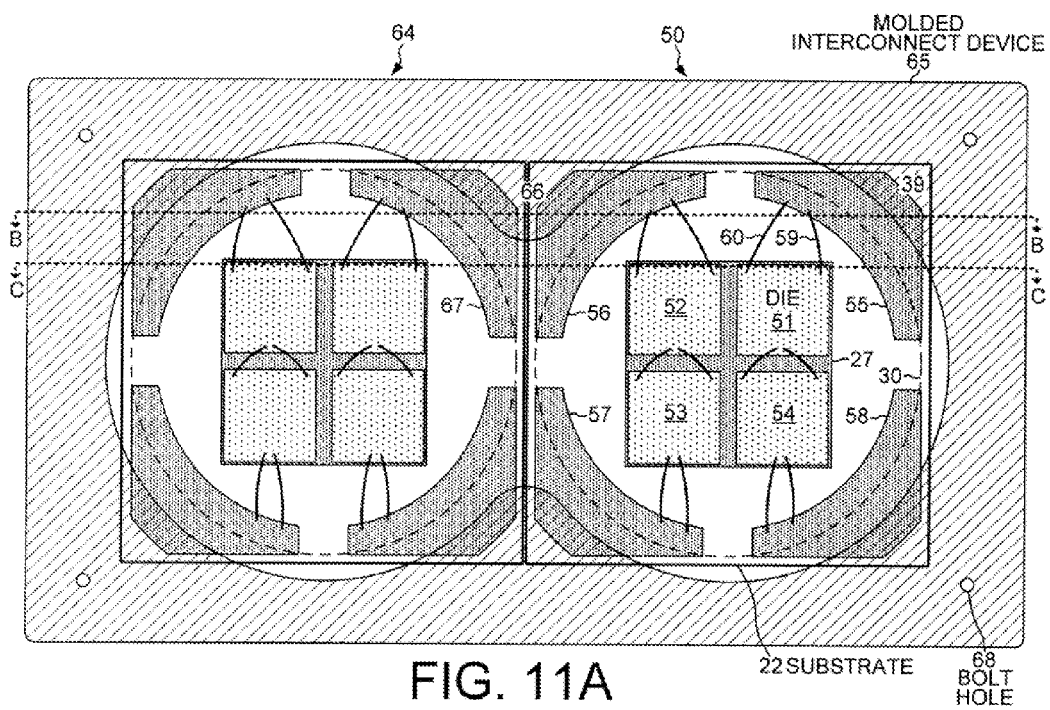
FIG. 11A is a top view of two photon building blocks in an interconnect structure built into an array product.

FIG. 11A is a top view of photon building block 50 of FIG. 9 built into an array product with another photon building block 64. A molded interconnect device 65 holds the photon building blocks 50 and 64 in place in a 1×2 array. The area of MID 65 is denoted by cross hatching. MID 65 has six lips that extend over the corners of photon building blocks 50 and 64 and hold those corners in place. For example, a lip 39 of MID 65 extends over the upper right corner of substrate 22, and a contact pad on the underside of lip 39 is electrically and mechanically connected to a portion of landing pad 55 using solder or an adhesive. MID 65 also has another lip 66 that extends over both the upper left corner of photon building block 50 and the upper right corner of photon building block 64. Separate contacts pads under lip 66 are bonded to landing pad 56 of photon building block 50 and to a landing pad 67 of photon building block 64. MID 65 has four holes 68 for the bolts 38 that attach the array product to heat sink 37.

Figure 11B:
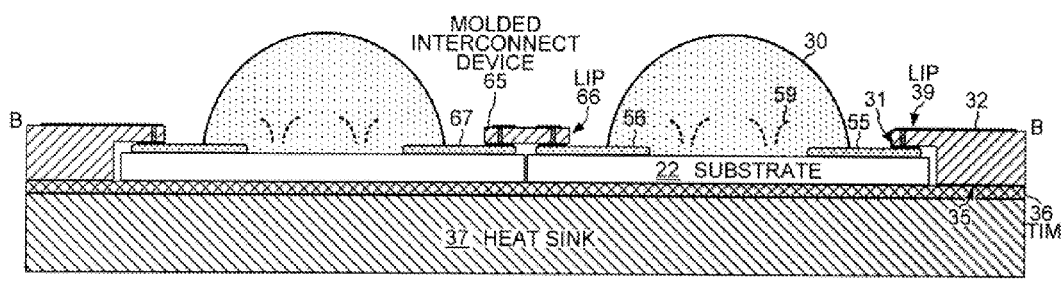
FIG. 11B is a cross-sectional view through line B-B of the array product shown in FIG. 11A.
Figure 11C:
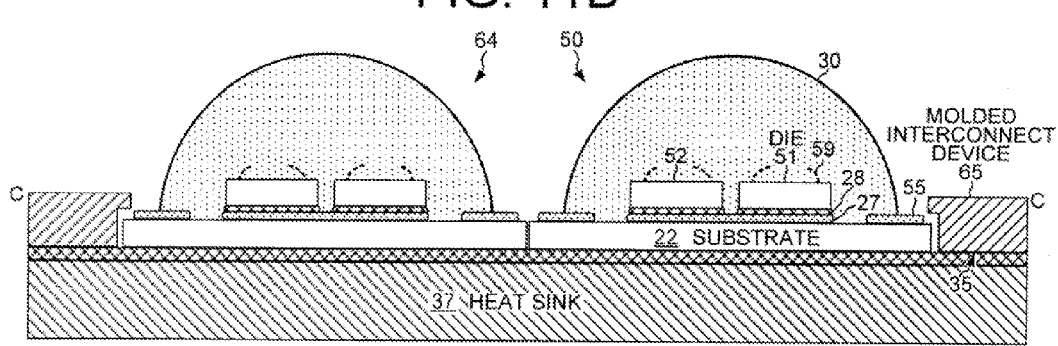
FIG. 11C is a cross-sectional view through line C-C of the array product shown in FIG. 11A.

FIG. 11B is a cross-sectional view through line B-B of the 1×2 array product shown in FIG. 11A. FIG. 11B shows how contact pad 31 on the underside of lip 39 is electrically and mechanically connected to a portion of landing pad 55. FIG. 11B also shows portions of the contact pads under lip 66 that bond to landing pads 56 and 67. FIG. 11C is a cross-sectional view through line C-C of the 1×2 array product shown in FIG. 11A. The contact pads of MID 65 are not visible in the cross section of FIG. 11C.

Figure 12A:
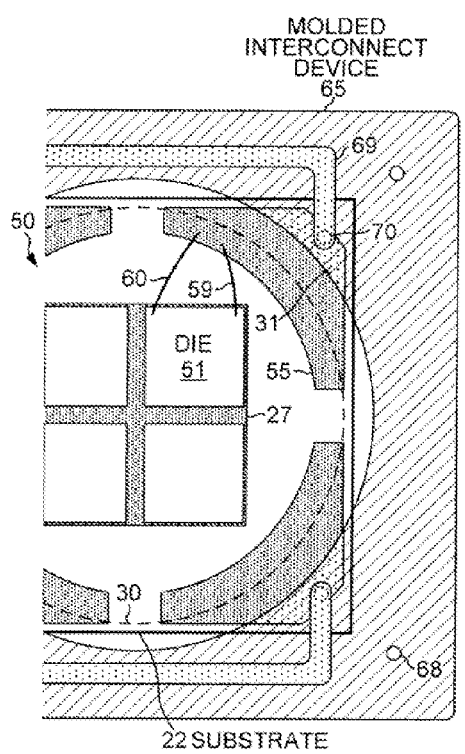
FIG. 12A is a more detailed view of the connection between the landing pad of the substrate and the contact pad of the interconnect structure shown in FIG. 11A.
Figure 12B:
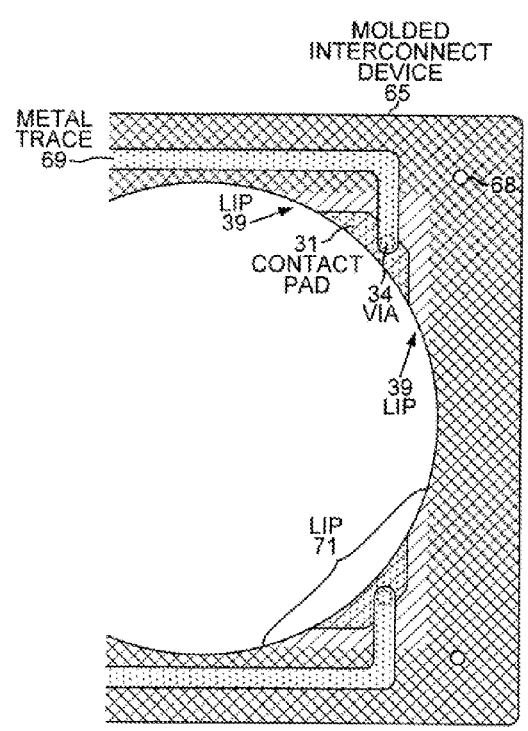
FIG. 12B shows the contact pad FIG. 12A without the landing pad below.

FIGS. 12A-B illustrate the connection between landing pad 55 and contact pad 31 of FIG. 11A in more detail. Contact pad 31 has the same outline shape as a corner of the landing pad 55 below. A solder reflow process can be performed with the contact pads on top aligning to solder on the landing pads below, or the process can be inverted. The structure of FIG. 11B can be inverted such that the landing pads are on top of the contact pad and align to molten solder on the contact pads.

In a SAC reflow process when the SAC solder on landing pad 55 is melted, the solder wets the metal of contact pad 31. Then the surface tension of the molten SAC solder pulls contact pad 31 over the portion of landing pad 55 that has the same shape. The four landing pads at the corners of substrate 22 are thereby each pulled towards the contact pads of the same shape and align photon building block 55 within the frame of MID 65. When the SAC solder cools and solidifies, bonds are formed between the landing pads and the contact pads. The solder bonds between the landing pads and the contact pads hold the photon building blocks in place such that the bottom surfaces of the substrates are substantially coplanar with bottom surface 35 of MID 65 even when the array product is not attached to a heat sink. The array product can be shipped unattached to any submount, such as a heat sink. The bonds between the landing pads and the contact pads are sufficiently strong to maintain the mechanical integrity of the array product despite the vibrations and bumping usually encountered in shipping.

FIG. 12A also shows a conductor 69 on the top surface of MID 65 that is electrically coupled to first LED die 51. Conductor 69 is a metal trace formed by plating a path oblated by a laser. Metal trace 69 is electrically coupled to LED die 51 through a solid metal via 70, contact pad 31, solder 48 or an ACF adhesive, landing pad 55 and wire bonds 59-60. The dashed line designates the extent of silicone lens 30.

FIG. 12B shows contact pad 31 of FIG. 12A without the landing pad 55 of photon building block 50 below. The triangular cross-hatched area around contact pad 31 is lip 39 that extends over the upper right corner of substrate 22 of photon building block 50. FIG. 12B also shows a lip 71 of MID 65 that extends over the lower right corner of substrate 22. The area of MID 65 shown with a latticed pattern is filled with liquid crystal polymer from top surface 33 to bottom surface 35 of the interconnect structure.

Figure 13:
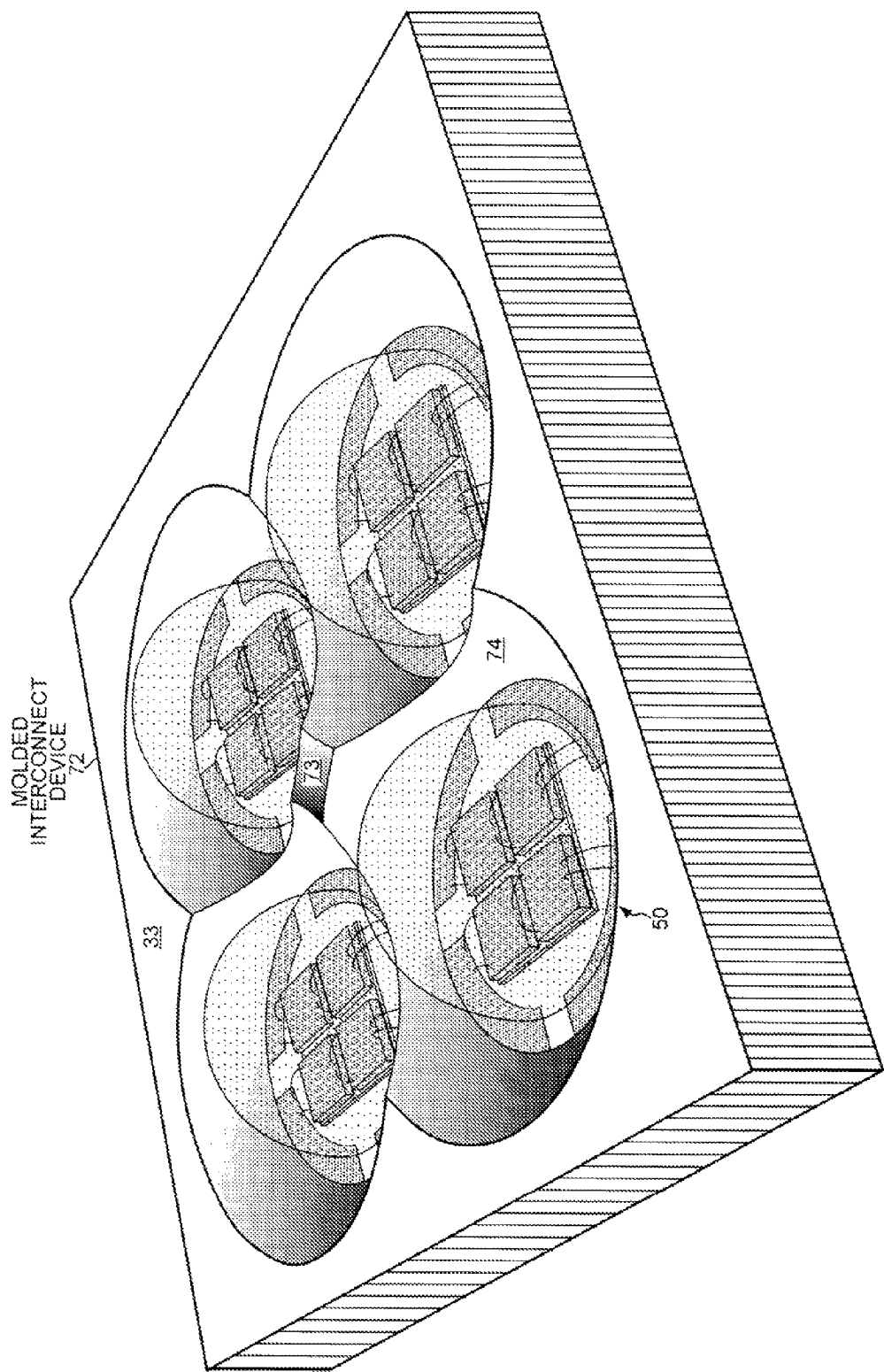
FIG. 13 is a perspective view of four photon building blocks in an interconnect structure built into an array product.

FIG. 13 is a perspective view of photon building block 50 of FIG. 9 built into an array product with three other photon building blocks. A molded interconnect device 72 holds the photon building blocks in place in a 2×2 array. The interconnect structure 72 includes bridges between the photon building blocks that support a center island 73 beneath which the contact pads attach to the inner landing pads of the four photon building blocks. As MID 72 is formed in a molding process, non-planar surfaces are easily made. MID 72 has curved walls 74 around the photon building blocks that are coated with a reflective material, such as a metal film. The curved walls can be shaped to impart a parabolic reflection to the light emitted from the photon building blocks. The conductors that connect to the contact pads (not shown in FIG. 13) are drawn with a laser over the curved walls and then plated in a metallization bath. The conductors are connected to the contact pads with through hole vias or hollow vias as shown in FIGS. 3-4. Although FIG. 13 depicts a 2×2 array of photon building blocks supported by an interconnect structure, arrays with other dimensions can also be made in a similar manner using bridges between the photon building blocks.

Figure 14:
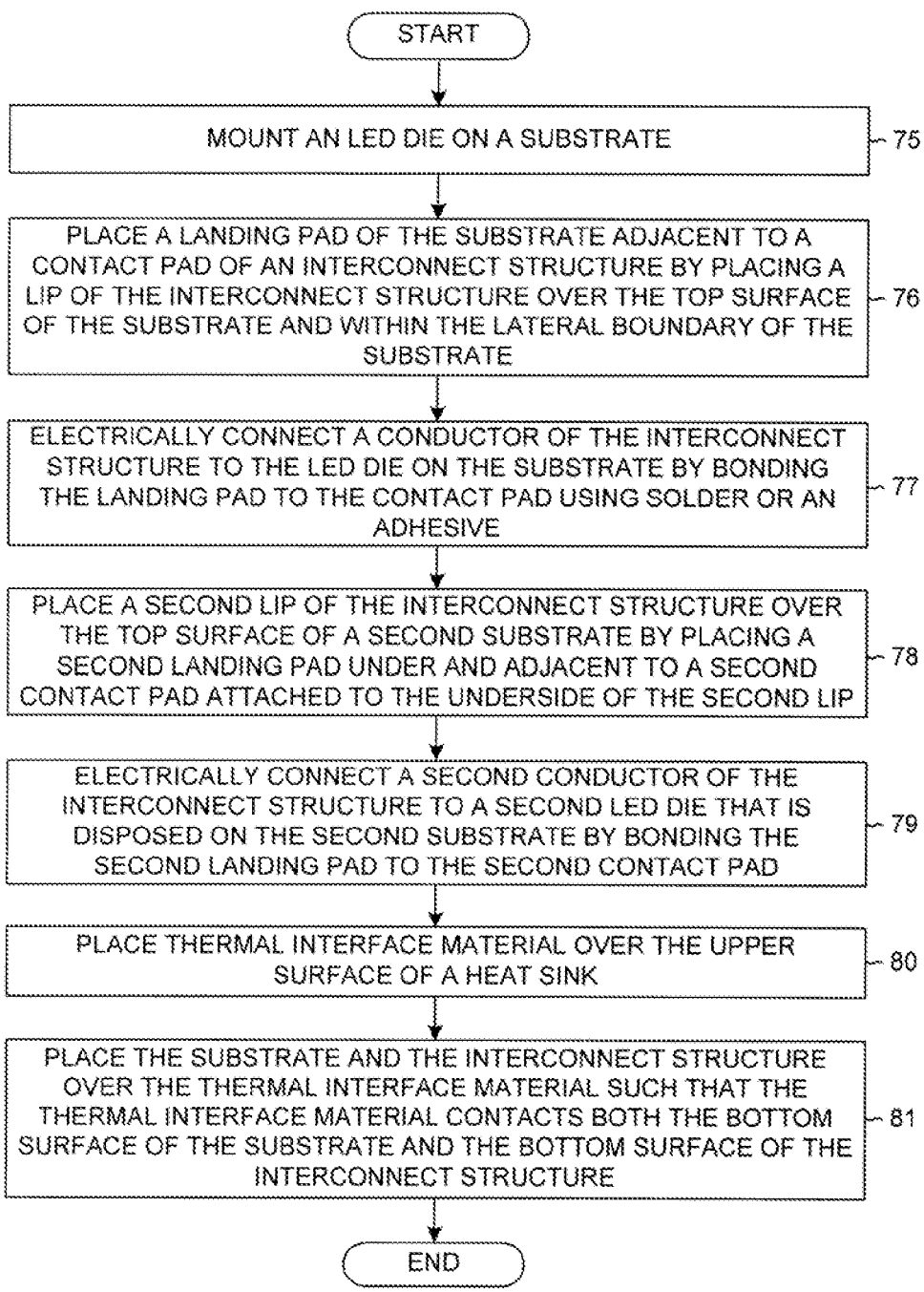
FIG. 14 is a flowchart of steps for making both a discrete light emitter and an array product using the same standardized photon building blocks.

FIG. 14 is a flowchart illustrating steps 75-81 of a method of making both a discrete light emitter and an array product using the same standardized photon building blocks that have one or more LED chips mounted on a carrier substrate. The method can be used to connect photon building blocks in any configuration, such as in parallel or in series, to achieve the desired light output and power consumption of the resulting array product. The method easily connects the photon building blocks electrically, mechanically and thermally to other structures of the ultimate lighting product. The electrical connections to the power source can easily be configured. The orientation of the photon building blocks can easily be aligned with reflectors and lenses of the lighting product. The position of the bolts that mechanically connect the interconnect structure to the lighting product can easily be reconfigured without changing the photon building blocks. And the interconnect structure can easily be configured to thermally connect with a multitude of heat sinks.

In a first step 75, light emitting diode die 51 is mounted on carrier substrate 22 of first photon building block 50. Substrate 22 has no electrical conductors passing from its top surface 25 to its bottom surface 26. LED die 51 is attached to substrate 22 using first TIM layer 27 and second TIM layer 28. Landing pad 55 on top surface 25 of substrate 22 is made from the same material and in the same process as first TIM layer 27.

In step 76, landing pad 55 is placed under and adjacent to contact pad 31, which is disposed on the underside of lip 39 of interconnect structure 65. In so doing, lip 39 is placed over top surface 25 of substrate 22 and within the lateral boundary of substrate 22. At the conclusion of step 76, the photon building blocks are placed within interconnect structure 65.

In step 77, conductor 32 of interconnect structure 65 is electrically connecting to LED die 51 by bonding landing pad 55 to contact pad 31. The pads are bonded by either solder or an ACF adhesive. When using solder, landing pad 55 is bonded to contact pad 31 by heating a metal alloy on landing pad 55 such that the landing pad aligns with the metal contact pad. When using anisotropic conductive adhesive film (ACF) technology to bond the pads, the photon building blocks are accurately positioned within interconnect structure 65, and landing pad 55 is bonded to contact pad 31 when the ACF adhesive is cured by heating. After landing pad 55 is aligned with and bonded to contact pad 31, bottom surface 26 of substrate 22 is substantially coplanar with bottom surface 35 of interconnect structure 65.

In step 78, when the method of FIG. 14 is used to make an array product, second lip 66 of interconnect structure 65 is placed over the top surface of a second substrate, and a second landing pad 67 is placed under and adjacent to a second contact pad attached to the underside of lip 66. The second substrate is part of second photon building block 64 and has dimensions that are substantially identical to those of the first substrate 22. A second LED die disposed on the second substrate has dimensions that are substantially identical to those of LED die 51 on first substrate 22.

In step 79, when the method of FIG. 14 is used to make an array product, a second conductor of interconnect structure 65 is electrically connected to the second LED die that is disposed on the second substrate by bonding second landing pad 67 to the second contact pad attached to the underside of lip 66. For example, landing pad 67 can be bonded to the second contact pad using a SAC reflow process or by using an anisotropic conductive adhesive. After second lip 66 is placed over the top surface of the second substrate and landing pad 67 is bonded to the contact pad on the underside of lip 66, the bottom surface of the second substrate is substantially coplanar to bottom surface 35 of interconnect structure 65.

In step 80, thermal interface material 36 is placed over the upper surface of heat sink 37. The upper surface of heat sink 37 need not be planar except under substrate 22 and the area directly around the substrate. For example, the upper surface of heat sink 37 can be the mostly curved surface of a luminaire. Likewise, bottom surface 26 of substrate 22 and bottom surface 35 of interconnect structure 65 need not be coplanar except in the immediate vicinity of substrate 22.

In step 81, substrate 22 and interconnect structure 65 are placed over thermal interface material 36 such that thermal interface material 36 contacts both bottom surface 26 of substrate 22 and bottom surface 35 of interconnect structure 65. When the method of FIG. 14 is used to make an array product, the second substrate of photon building block 64 is also placed over thermal interface material 36 such that thermal interface material 36 contacts the bottom surface of the second substrate. The method of FIG. 14 can also be used to make an array product with more than two photon building blocks, such as the array product shown in FIG. 13.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:
1. A device comprising:
   a first light emitting diode (LED) die;
   a first substrate comprising a top surface, a bottom surface and a lateral boundary, wherein the first LED die is disposed above the top surface of the first substrate and is electrically connected to a landing pad disposed on the top surface of the first substrate, and wherein the first substrate is free of any fasteners and electrical connections extending from the top surface of the first substrate to the bottom surface of the first substrate through a via in the first substrate or a mouse bite on the lateral boundary of the first substrate; and an interconnect structure comprising a contact pad, an opening and a bottom surface, wherein:
the first substrate is electrically and mechanically fixedly attached to the interconnect structure solely through the contact pad on the interconnect structure which contacts the landing pad on the first substrate;
the first LED is substantially centered within the opening of the interconnect structure;
the interconnect structure is securely attached to a heat sink; and
the bottom surface of the first substrate is thermally coupled to the heat sink by a force exerted from the interconnect structure to the first substrate.

2. The device of claim 1,
wherein the contact pad is disposed on an underside of a lip of the interconnect structure, wherein the landing pad and the contact pad are attached by a solder or adhesive.

3. The device of claim 1, wherein the interconnect structure has a lip, and wherein the lip extends over the first substrate within the lateral boundary.

4. The device of claim 1, further comprising:
a second substrate whose dimensions are substantially identical to those of the first substrate;
a second LED die disposed on the second substrate, wherein the second LED die has dimensions that are substantially identical to those of the first LED die, wherein no conductor passes from a top surface of the second substrate to a bottom surface of the second substrate, wherein the bottom surface of the interconnect structure and the bottom surface of the second substrate are substantially coplanar, and wherein a second conductor of the interconnect structure is electrically coupled to the second LED die.

5. The device of claim 1, wherein the interconnect structure is taken from the group consisting of: a molded interconnect device (MID), an FR-4 epoxy circuit board, and a lead frame structure.

6. The device of claim 1, further comprising:
a thermal interface material, wherein the bottom surface of the first substrate contacts the thermal interface material, and wherein the upper surface of the heat sink contacts the thermal interface material.

7. The device of claim 6, wherein the bottom surface of the interconnect structure contacts the thermal interface material.

8. The device of claim 1, further comprising:
an anisotropic conductive adhesive, wherein the conductor of the interconnect structure is electrically coupled to the first LED die through the anisotropic conductive adhesive.

9. The device of claim 8, wherein the anisotropic conductive adhesive mechanically connects the interconnect structure to the first substrate.

10. A method comprising:
mounting a light emitting diode (LED) die on a substrate, wherein the substrate comprises a top surface, a bottom surface and a lateral boundary, wherein the LED die is disposed above the top surface of the substrate and is electrically connected to a landing pad disposed on the top surface of the substrate, and wherein the substrate is free of any fasteners and electrical connections extending from-the top surface of the substrate to the bottom surface of the substrate through a via in the substrate or a mouse bite on the lateral boundary of the substrate;
placing the landing pad adjacent to a contact pad disposed on an underside of a lip of an interconnect structure, wherein the interconnect structure comprises a bottom surface, the contact pad, and an opening; and
electrically and mechanically fixedly attaching the substrate to the interconnect structure solely through the contact pad on the interconnect structure which contacts the landing pad on the first substrate;
substantially centering the LED within the opening of the interconnect structure;
securely attaching the interconnect structure to a heat sink; and
thermally coupling the bottom surface of the first substrate to the heat sink by a force exerted from the interconnect structure to the first substrate.

11. The method of claim 10, wherein the interconnect structure includes a conductor, and wherein the substrate is electrically and mechanically fixedly attached to the interconnect structure by heating the conductor of the interconnect structure.

12. The method of claim 10, and wherein the placing the landing pad adjacent to the contact pad involves placing the lip within the lateral boundary of the substrate.

13. The method of claim 10, wherein the interconnect structure is taken from the group consisting of: a molded interconnect device (MID), an FR-4 epoxy circuit board, and a lead frame structure.

14. The method of claim 10, further comprising:
placing a thermal interface material over an upper surface of the heat sink; and
placing the substrate and the interconnect structure over the thermal interface material such that the thermal interface material contacts both the bottom surface of the substrate and the bottom surface of the interconnect structure.

15. A method comprising:
mounting a first light emitting diode (LED) die on a first substrate, wherein the first substrate has a top surface, a bottom surface and a lateral boundary, and wherein the first substrate is free of any fasteners and electrical connections extending from-the top surface of the first substrate to the bottom surface of the first substrate through a via in the substrate or a mouse bite on the lateral boundary of the first substrate; and
placing a first lip of an interconnect structure over the top surface of the first substrate and within the lateral boundary, wherein the interconnect structure has a bottom surface, and wherein the bottom surface of the interconnect structure and the bottom surface of the first substrate are substantially coplanar after the first lip is placed over the top surface; and
electrically fixedly connecting a conductor of the interconnect structure to the LED die.

16. The method of claim 15, further comprising:
placing a second lip of the interconnect structure over a top surface of a second substrate, wherein the bottom surface of the interconnect structure and a bottom surface of the second substrate are substantially coplanar after the second lip is placed over the top surface of the second substrate; and
electrically fixedly connecting a second conductor of the interconnect structure to a second LED die disposed on the second substrate, wherein the second substrate has dimensions that are substantially identical to those of the first substrate, and wherein the second LED die has dimensions that are substantially identical to those of the first LED die.

17. The method of claim 15, wherein the interconnect structure is taken from the group consisting of: a molded interconnect device (MID), an FR-4 epoxy circuit board, and a lead frame structure.

18. The method of claim 15, further comprising:
placing a thermal interface material over an upper surface of a heat sink; and
placing the first substrate and the interconnect structure over the thermal interface material such that the thermal interface material contacts both the bottom surface of the first substrate and the bottom surface of the interconnect structure.

19. A device comprising:
a light emitting diode (LED) die;
a substrate with a top surface, a bottom surface and a lateral boundary, wherein the LED die is disposed above the substrate, and wherein the substrate is free of any fasteners and electrical connections extending from-the top surface of the substrate to the bottom surface of the substrate through a via in the substrate or a mouse bite on the lateral boundary of the substrate; and
means for electrically fixedly coupling the LED die to a conductor located outside the lateral boundary of the substrate, wherein the means has a bottom surface that is substantially coplanar with the bottom surface of the substrate.

20. The device of claim 19, further comprising:
a landing pad disposed on the top surface of the substrate, wherein the means is attached to the landing pad by a solder or adhesive.

21. The device of claim 19, further comprising:
a landing pad disposed on the top surface of the substrate, wherein the landing pad aligns the substrate to a contact pad on the means when a solder disposed between the landing pad and the contact pad is heated.

22. The device of claim 1, wherein the bottom surface of the interconnect structure and the bottom surface of the first substrate are substantially coplanar.

23. The device of claim 1, wherein the first substrate is free on any features to mechanically attach the first substrate a heat sink.

24. The device of claim 1, wherein the first substrate is free holes or mouse bites to mechanically attach the first substrate a heat sink.

25. The device of claim 1, wherein the first substrate is a closed substrate.

26. The device of claim 1, wherein the first LED is within 3 mm of the lateral boundary of the first substrate.

27. The device of claim 1, wherein the interconnect structure further comprises:
an external electrical connector to connect to an external power source, the external electrical connector electrically coupled to the landing pad; and
an external mechanical connector to mechanically attach the interconnect structure to an external component;
wherein the mechanical and electrical connectors are recessed into the interconnect structure.

28. The device of claim 1, wherein:
the interconnect structure comprises a pocket;
the first substrate is disposed within the pocket; and
the bottom surface of the interconnect structure and the bottom surface of the first substrate are substantially coplanar.

29. The device of claim 1, wherein:
the interconnect structure comprises a pocket;
the first substrate is disposed within the pocket; and
the first LED comprises a light emitting surface that extends into the opening of the interconnect structure and is substantially co-planar with a top surface of interconnect structure.

30. The device of claim 1, wherein the lateral boundary of the first substrate is a polygon comprising a maximum of four sides.

31. A device comprising:
a light emitting diode (LED) die mounted on a top surface of a substrate, the LED die is electrically connected to a landing pad disposed on the top surface of the substrate;
an interconnect structure fixedly connected to the substrate via a contact pad on the interconnect structure which is fixedly connected to the landing pad on the substrate;
wherein all external electrical and mechanical connections to the LED die are made through the interconnect structure.

32. The device of claim 31, wherein a bottom surface of the interconnect structure and a bottom surface of the substrate are substantially coplanar.

33. The device of claim 31, wherein the substrate is free on any features to mechanically attach the substrate a heat sink.

34. The device of claim 31, wherein the substrate is free holes or mouse bites to mechanically attach the substrate a heat sink.

35. The device of claim 31, wherein the substrate is a closed substrate.

36. The device of claim 31, wherein the LED is within 3 mm of a lateral boundary of the substrate.

37. The device of claim 31, wherein the interconnect structure further comprises:
an external electrical connector to connect to an external power source, the external electrical connector electrically coupled to the landing pad; and
an external mechanical connector to mechanically attach the interconnect structure to an external component;
wherein the mechanical and electrical connectors are recessed into the interconnect structure.

38. The device of claim 31, wherein:
the interconnect structure comprises a pocket;
the substrate is disposed within the pocket; and
a bottom surface of the interconnect structure and a bottom surface of the substrate are substantially coplanar.

39. The device of claim 31, wherein:
the interconnect structure comprises a pocket;
the substrate is disposed within the pocket; and
the LED comprises a light emitting surface that extends into an opening of the interconnect structure and is substantially co-planar with a top surface of interconnect structure.

40. The device of claim 31, wherein the substrate comprises a lateral boundary having the shape of a polygon, the polygon comprising a maximum of four sides.

* * * * *